(12) United States Patent
Yousef

(10) Patent No.: US 7,450,518 B2
(45) Date of Patent: Nov. 11, 2008

(54) SPARSE CHANNEL DUAL-ERROR TRACKING ADAPTIVE FILTER/EQUALIZER

(75) Inventor: Nabil R. Yousef, Foothill Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 857 days.

(21) Appl. No.: 10/951,318

(22) Filed: Sep. 27, 2004

(65) Prior Publication Data

US 2005/0053129 A1 Mar. 10, 2005

Related U.S. Application Data

(63) Continuation-in-part of application No. 10/386,795, filed on Mar. 12, 2003, and a continuation-in-part of application No. 10/387,251, filed on Mar. 12, 2003, now Pat. No. 7,230,983.

(51) Int. Cl.
*H04J 3/14* (2006.01)
(52) U.S. Cl. .................. 370/242; 370/441; 370/228; 375/232; 375/233
(58) Field of Classification Search ................ 370/216, 370/228, 225, 242, 252, 277, 278, 437, 441, 370/442, 479; 375/229, 231–233, 346
See application file for complete search history.

(56) References Cited

U.S. PATENT DOCUMENTS

| | | | | |
|---|---|---|---|---|
| 5,282,155 A | * | 1/1994 | Jones | .......................... 708/322 |
| 6,122,015 A | * | 9/2000 | Al-Dhahir et al. | ............ 348/614 |
| 6,665,308 B1 | * | 12/2003 | Rakib et al. | .................. 370/441 |
| 6,842,516 B1 | * | 1/2005 | Armbruster | ............ 379/390.02 |
| 7,061,977 B2 | * | 6/2006 | Martin et al. | ................ 375/233 |
| 7,224,726 B2 | * | 5/2007 | Perlow et al. | ................ 375/233 |
| 2002/0159543 A1 | * | 10/2002 | Perlow et al. | ................ 375/324 |
| 2004/0015529 A1 | * | 1/2004 | Tanrikulu et al. | ............ 708/322 |

* cited by examiner

*Primary Examiner*—Ricky Ngo
*Assistant Examiner*—Dady Chery
(74) *Attorney, Agent, or Firm*—Garlick Harrison & Markison; Bruce E. Garlick

(57) ABSTRACT

An adaptive filter has a plurality of filter coefficients and a filter coefficients processing unit trains of the adaptive filter. The filter coefficients processing unit is operable to iterate to alter the plurality of filter coefficients of the communication system filter. Every Nth iteration, the filter coefficients processing unit is operable to identify a first group of filter coefficients of the plurality of filter coefficients that satisfy filter coefficient threshold rules and a second group of filter coefficients of the plurality of filter coefficients that do not satisfy the filter coefficient threshold rules. Every iteration, the filter coefficients processing unit is operable to: (1) update the first group of filter coefficients using a first step size and a first error signal; and (2) update the second group of filter coefficients using a second step size and a second error signal.

24 Claims, 11 Drawing Sheets

(known)

(example)

prior art receiver

*prior art equalizer*

*channel equalizer 10* channel equalizer 30 sparse channel equalizing module 32 and/or 36

SPARSE CHANNEL DUAL-ERROR TRACKING ADAPTIVE FILTER/EQUALIZER

CROSS REFERENCES TO RELATED APPLICATIONS

This application is:

1. A continuation-in-part of U.S. Regular Utility application Ser. No. 10/386,795, filed Mar. 12, 2003, which is incorporated herein by reference in its entirety for all purposes; and 2. A continuation-in-part of U.S. Regular Utility application Ser. No. 10/387,251, filed Mar. 12, 2003, now U.S. Pat. No. 7,230,983 which is incorporated herein by reference in its entirety for all purposes.

FIELD OF THE INVENTION

This invention relates generally to communication systems and more particularly to equalization of channel response in a receiver operating in a communication system.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), broadcast standard television (NTSC), broadcast high definition television (HDTV), satellite broadcasts, local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, television receiver, home entertainment equipment, et cetera communicates directly or indirectly with other wireless communication devices or receives broadcast wireless communications. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network. For broadcast communications, a broadcasting station transmits via a transmitting tower a wireless communication (e.g., an HDTV broadcast, an NTSC broadcast, etc.) to wireless communication devices (e.g., television, satellite receiver, HDTV, etc.) via a wireless communication channel in the UHF (ultra high frequency) and/or VHF (very high frequency) frequency range.

FIG. 1 illustrates an example of a broadcast wireless communication or reception of an indirect wireless communication via a base station or access point. As shown, a transmitting tower (base station or access point) transmits a radio frequency signal. A receiving wireless communication device, which may be a television, HDTV, cellular telephone, satellite receiver, radio, etc., receives the signal via multiple paths. In this example, the receiving wireless communication device receives the signal via four paths, i.e., via a multiple path communication channel. Via the first path, the signal reflects off of an object, which may be a building, mountain, hill, truck, etc. Via the second path, the signal reflects off of one or more buildings. The third path is a direct line of sight path, even though intervening objects may be positioned between the transmitting tower and the receiving device, where the objects may attenuate the signal. Via the fourth path, the signal reflects off of the ground.

Depending on the distance between the transmitting tower and the receiving device, attenuation properties of intervening objects, and the path in which the signal traverses, the receiving device receives multiple representations of the signal at different times with different signal strengths. FIG. 2 is a graphical diagram that depicts the multiple path communication channel of FIG. 1. As shown, at time t0, the transmitting tower transmits a signal at a certain power level (i.e., signal strength). At some time later, which depends upon the length of the path over which the signal traverses, the receiving devices receives the signal. As shown, the receiving device first receives the signal via path 3, then the signal via path 2, then the signal via path 1, and finally via path 4. As is also shown, the signal strength of the signal received via the different paths is varied. The received signal strength is dependent on the impedance (i.e., resulting in attenuation of the signal) of the path over which the signal traverses. In this example, even though path 3 is a line of sight path, it attenuates the signal more than reflected path 2.

For a wireless communication device to participate in wireless communications, it includes a receiver and may further include a transmitter. As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

The receiver may be constructed as illustrated in FIG. 3. Such a receiver includes an antenna, a receiver (Rx) filter module, a low noise amplifier (LNA), a down-conversion module, a local oscillation module, an analog to digital converter (ADC), an equalizer, and a data recovery module. In general, the antenna receives radio frequency (RF) signals and provides them to the Rx filter module. The Rx filter module band pass filters the received RF signals to pass RF signals in a certain frequency range. The Rx filter module may be tunable such that the receiver may be adjusted to receive different channels (i.e., different RF signals).

The LNA amplifies the filtered RF signals and provides the amplified signals to the down-conversion module. The down conversion module converts the amplified RF signals into analog baseband signals based on one or more local oscillations provided by the local oscillation module. The analog to digital converter converts the analog baseband signals into digital baseband signals. The equalizer, which will be discussed in greater detail with reference to FIG. 4, functions to reduce the adverse affects of the multiple-path via which the RF signals were received. Accordingly, the equalizer compensates for the timing differences of the received RF signal via the multiple paths and for the attenuation introduced by each of the multiple paths. The data recovery module receives the equalized signal and recovers the data therefrom.

FIG. 4 illustrates a discrete time symbol-spaced Decision Feedback Equalizer (DFE). The equalizer includes a Feed Forward Equalizer (FFE) 104, a Decision block 106, and a Feed Back Equalizer (FBE) 108. The equalizer receives an input sequence y(n) via a channel, where y(n) is complex and is corresponds to the transmit signal x(n), which is also complex, attenuated by the channel [H(z)] and noise of the channel [v(n)]. Additive noise v(n) is white Gaussian with power spectral density $\sigma_v^2$. Furthermore, the decisions $\check{x}(n-\delta)$ are assumed to be correct, and hence equal to $x(n-\delta)$. This assumption makes the design of the FBE 108 and FFE 104 easier, but at the expense of introducing error propagation due to possibly wrong decisions. The FFE 104 function G(z) has length L. The channel (impulse) response vector of the channel h is given in Equation (1) as:

$$h \triangleq [h(0) \ h(1) \ ... \ h(N-1)] \quad \text{Equation (1)}$$

The number of coefficients (taps) M of the FBE 108 function B(z) is assumed greater or equal to the channel memory, i.e., $M \geq N-1$. These modeling assumptions are feasible in practice.

In estimating FFE 104 and FBE 108 equalizer coefficients, the goal is to minimize the mean square error quantity of Equation (2).

$$\zeta = E|x(n-\delta) - \hat{x}(n-\delta)|^2, \quad \text{Equation (2)}$$

where $\hat{x}(n-\delta)$ is the delayed input signal estimate prior to the Decision block 106. By collecting the coefficients of both G(z) and B(z) into vectors, we can express the received signal $\hat{x}(n-\delta)$ in Equation (3) as:

$$x_n = y_n g - \check{x}_n b \quad \text{Equation (3)}$$

A channel output model defining $y_n$ may be expressed by:

$$y_n = x_n H + v_n \quad \text{Equation (4)}$$

where H is the (N+L−1)×L convolution matrix corresponding to the channel response and expressed as:

$$H = \begin{bmatrix} h(0) & 0 & \cdots & 0 \\ h(1) & h(0) & \cdots & 0 \\ \vdots & \vdots & \ddots & \vdots \\ h(N-1) & h(N-2) & \ddots & h(0) \\ 0 & h(N-1) & \ddots & h(1) \\ \vdots & \vdots & \ddots & \vdots \\ 0 & 0 & \cdots & h(N-1) \end{bmatrix} \quad \text{Equation (5)}$$

In this model, $x_n$ is the 1×(N+L−1) input vector, $$x_n \triangleq [x(n) \ x(n-1) \ ... \ x(n-N-L+2)] \quad \text{Equation (6)}$$

$y_n$ is the 1×L input regression vector to the FFE 104, $$y_n \triangleq [y(n) \ y(n-1) \ ... \ y(n-L+1)] \quad \text{Equation (7)}$$

$\check{x}_n$ is the 1×M input regression vector to the (strictly causal) FBE 108, $$\check{x}_n \triangleq [x(n-\delta-1) \ x(n-\delta-2) \ ... \ x(n-\delta-M)] \quad \text{Equation (8)}$$

and $v_n$ is the 1×L vector noise process.

The current efficient methods for computing the optimal filter coefficients of a decision feedback equalizer, which optimizes (1), are based on the well-known Cholesky decomposition method (from a finite-dimension problem formulation). Two published papers: (1) N. Al-Dhahir and J. M. Cioffi, "MMSE Decision-Feedback Equalizers: Finite-Length Results," IEEE Trans. on Information Theory, vol. 41, no. 4, pp. 961-973, July 1995; and (2) N. Al-Dhahir and J. M. Cioffi, "Fast Computation of Channel-Estimate Based Equalizers in Packet Data Transmission," IEEE Trans. on Signal Processing, vol. 43, no. 11, pp. 2462-2473, November 1995 provide one procedure for computing optimal DFE settings. These equations are referred to hereinafter as "Al-Dhahir's equations."

Another type of often employed in wireless communication systems is the linear equalizer, e.g., Finite Impulse Response (FIR) filter. While the linear equalizer does not suffer from error propagation as does the DFE, it is not as effective in removing Inter-Symbol Interference (ISI) from a received symbol stream. Linear equalizers are often used in wireless communication systems because of their simplicity of design and implementation. Determination of taps of the linear equalizer is also difficult.

As can be ascertained for the above discussion, the determination of filter coefficients, or taps, for an equalizer is an involved process and requires a substantial amount of computational power to adequately equalize signals in today's high performance wireless communication devices. In some applications, long filters are needed, for example for HDTV channels, where implementing such long filters for channel estimation, tap computation, and equalization have practical limitations due to the need for a large number of coefficient multipliers. Furthermore, computing the taps of such long equalizer would also require a large number of multipliers, which, on a per multiplier basis, occupies a relatively large integrated circuit die area.

Therefore, a need exists for an equalizer that can meet the challenges of today's high performance wireless communication devices, provides accurate channel estimation, tap computation, and equalization for long filters while reducing the number of multipliers.

BRIEF SUMMARY OF THE INVENTION

These needs and others are substantially met by a communication system filter constructed according to the present invention. The communication system filter includes an adaptive filter and a filter coefficients processing unit. The adaptive filter has a plurality of filter coefficients and produces an output in response to a received signal. The filter coefficients processing unit is operable to cause adaptive filter training of the adaptive filter. The filter coefficients processing unit is operable to iterate to alter the plurality of filter coefficients of the communication system filter. Every Nth iteration, the filter coefficients processing unit is operable to identify a first group of filter coefficients of the plurality of filter coefficients that satisfy filter coefficient threshold rules and a second group of filter coefficients of the plurality of filter coefficients that do not satisfy the filter coefficient threshold rules. Each iteration, the filter coefficients processing unit is operable to: (1) update the first group of filter coefficients using a first step size and a first error signal; and (2) update the second group of filter coefficients using a second step size and a second error signal.

In identifying the first group of filter coefficients of the plurality of filter coefficients that satisfy filter coefficient threshold rules and the second group of filter coefficients of the plurality of filter coefficients that do not satisfy the filter coefficient threshold rules, the filter coefficients processing unit may compare the magnitude of each filter coefficient of the plurality of filter coefficients to a filter coefficient threshold value. When the magnitude of a filter coefficient exceeds the filter coefficient threshold value, the filter coefficients processing unit assigns the filter coefficient to the first group of filter coefficients. When the magnitude of the filter coefficient does not exceed the filter coefficient threshold value, the filter coefficients processing unit assigns the coefficient to the second group of filter coefficients. In one operation, the filter coefficients processing unit is further operable to assign the filter coefficient to the first group of filter coefficients when the magnitude of at least one filter coefficient within a neighbor group of filter coefficients exceeds the threshold value.

In one of its operations, the filter coefficients processing unit is operable to, every Nth iteration, determine: (1) the first step size so that it is inversely proportional to a number of filter coefficients in the first group of filter coefficients; and (2) determine the second step size. The filter coefficients processing unit may determine the second step size so that it is inversely proportional to a number of filter coefficients in the second group of filter coefficients.

At each iteration, the filter coefficients processing unit may be operable to update the first group of filter coefficients using the first step size and the first error signal by: (1) determining a first filter output in response to the received signal by using only the first group of filter coefficients; and (2) determining the first error signal based upon the first filter output and the expected output. Further, each iteration, the filter coefficients processing unit may be operable to update the second group of filter coefficients using the second step size and the second error signal by: (1) determining a second filter output in response to the received signal using all of the plurality of filter coefficients; and (2) determining the second error signal based upon the second filter output and the expected output.

The communication system filter may be one of a linear equalizer, a portion of a decision feedback equalizer, and a decision feedback equalizer. The filter coefficients processing unit may be operable to iterate using one of a Least Mean Squares (LMS) algorithm and a modified LMS algorithm.

In addition, other aspects, advantages, and novel features of the invention will become apparent from the following detailed description of the invention when considered in conjunction with the accompanying drawings.

DETAILED DESCRIPTION OF THE INVENTION

Figure 5:
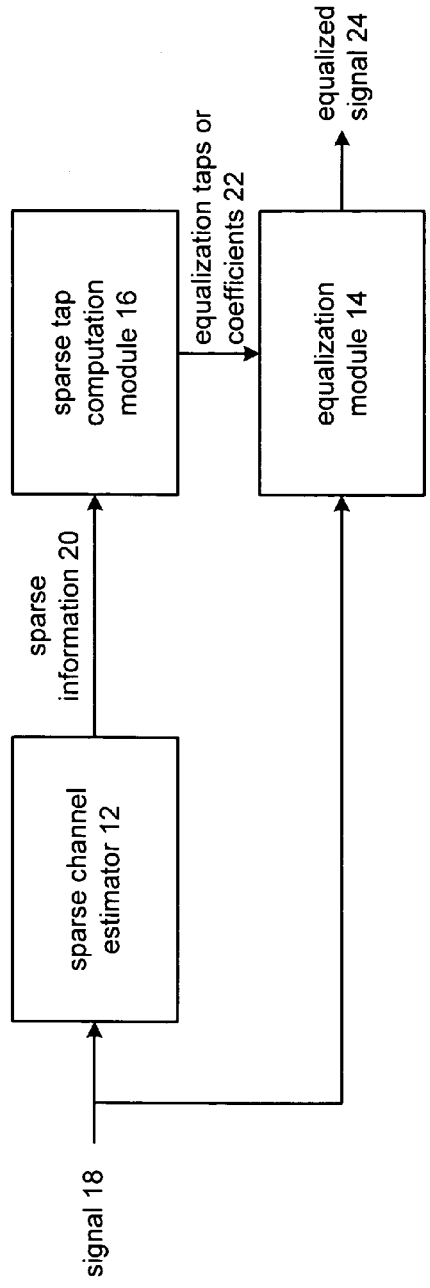
FIG. 5 is a schematic block diagram of a channel equalizer in accordance with the present invention.

FIG. 5 is a schematic block diagram of a channel equalizer 10 that includes a sparse channel estimator 12, a sparse tap computation module 16, and an equalization module 14. The sparse channel estimator 12 is operably coupled to receive a signal 18 via a multiple path communication channel. The signal 18 may be any radio frequency (RF) signal, for example, but not limited to, broadcast television, high definition broadcast television, cellular telephone transmissions, and satellite transmission. In general, the multiple path communication channel includes a number of paths, where, from path to path, there is a relatively significant difference in length. As such, to filter such a multiple path communication channel, a long filter (i.e., a filter requiring thousands of coefficient taps) is needed. However, when the number of paths within the multiple path communication channel is relatively small, such as the case for HDTV, a significant number of the taps in the long filter are zero or near zero, thus are insignificant. Accordingly, the sparse channel estimator 12 generates sparse information 20 or a sparse channel estimate, which will be described in greater detail with reference to FIGS. 7, 10-12, that indicates where there is significant energy of the multiple path communication channel, i.e., channel taps of the multiple path communication channel.

The sparse tap computation module 16 receives the sparse information 20 and generates equalization taps, or coefficients, 22 there from. The sparse tap computation module 16 interprets the sparse information 20 to identify locations within the channel estimate where the taps of the filter will be non-zero, or above some threshold greater than zero. For each of these identified locations, the sparse tap computation module 16 generates a corresponding equalization tap value. The various methodologies for generating the equalization taps will be described in greater detail with reference to FIGS. 10-12.

The equalization module 14, which may be a linear equalizer or feedback equalizer, receives the equalization taps 22 to generate a corresponding filter. The equalization module 14 then filters the signal 18 to produce an equalized signal 24. The equalization module 14 will be described in greater detail with reference to FIGS. 6 and 8.

Figure 1:
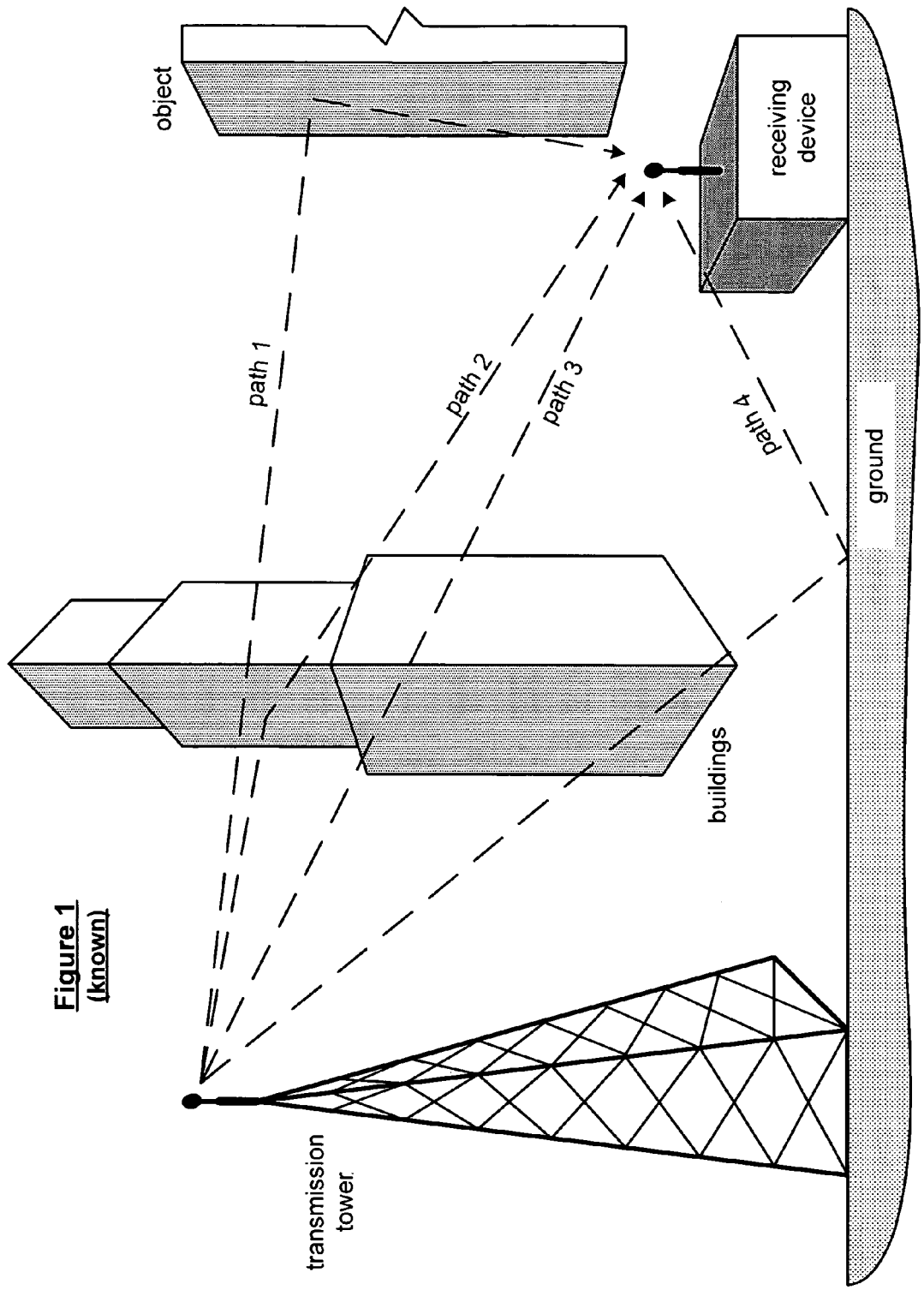
FIG. 1 is a graphical representation of known multiple path communications.
Figure 2:
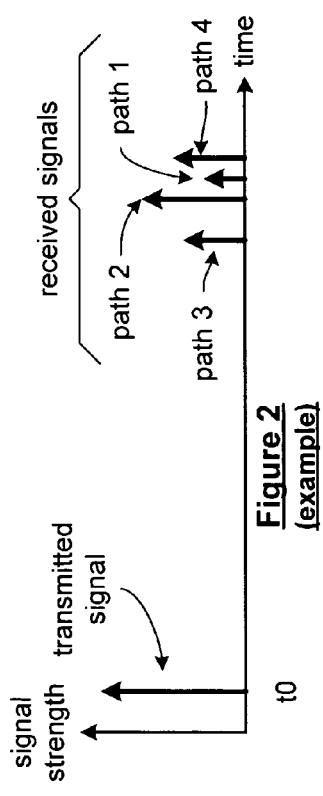
FIG. 2 is a graphical representation of multiple path communications.
Figure 3:
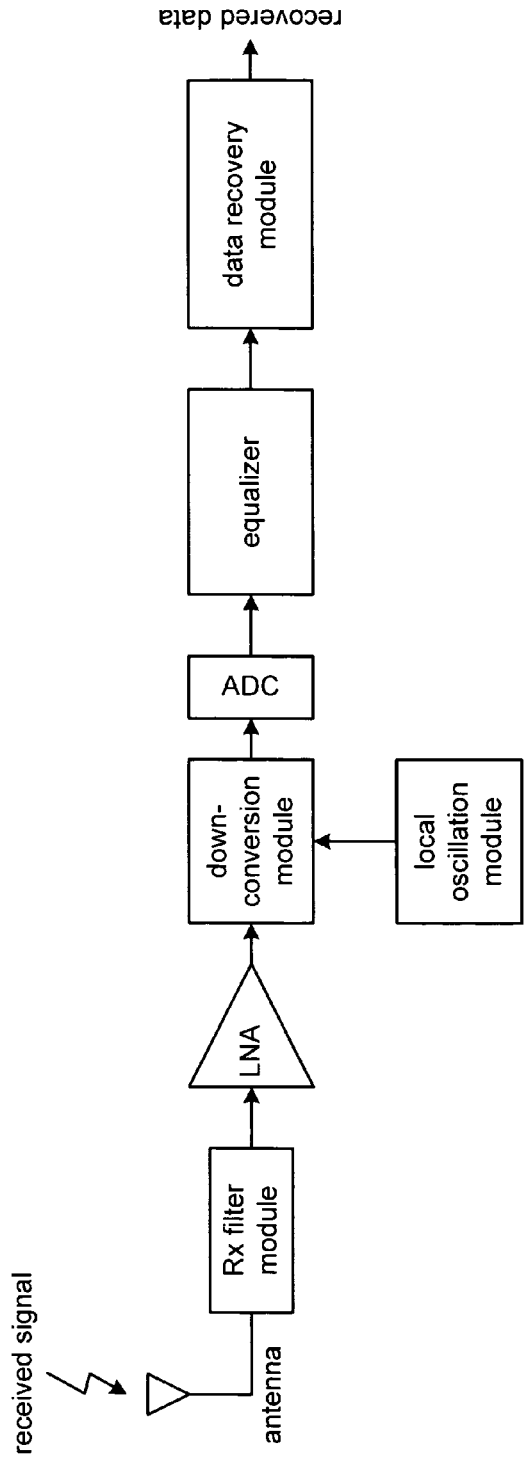
FIG. 3 is a schematic block diagram of a prior art receiver.
Figure 4:
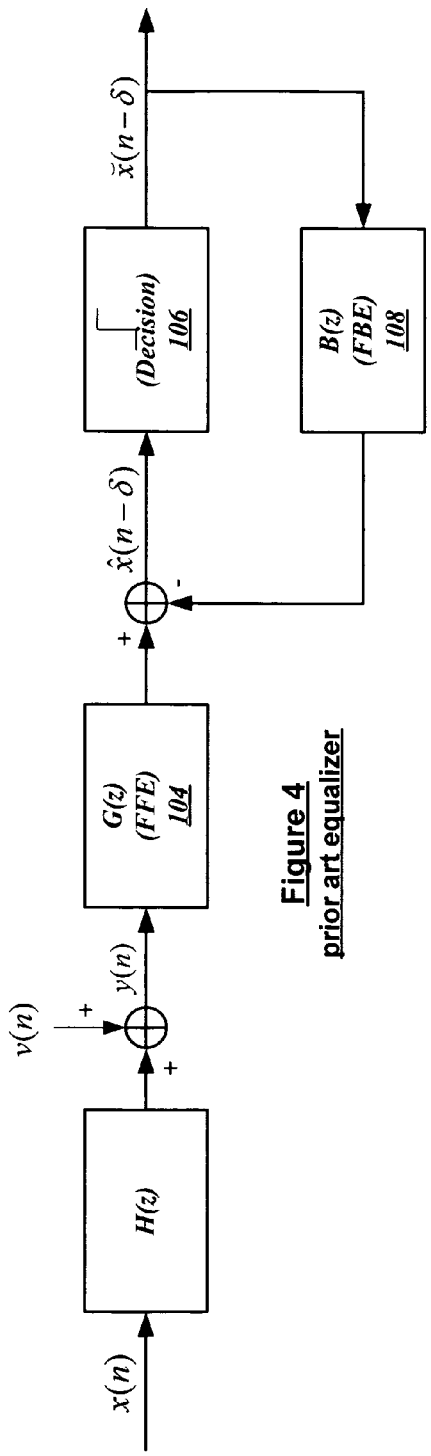
FIG. 4 is a schematic block diagram of a prior art equalizer.

The channel equalizer 10 may be incorporated in the receiver shown in FIG. 3 replacing the equalizer shown in FIG. 4. By utilizing a channel equalizer 10, as illustrated in FIG. 5, in a receiver of a wireless communication device, the channel equalizer 10 provides accurate channel estimation, tap computation, and equalization for the long filtering needed within such wireless communication systems while reducing the number of multipliers needed for such filtering.

Figure 6:
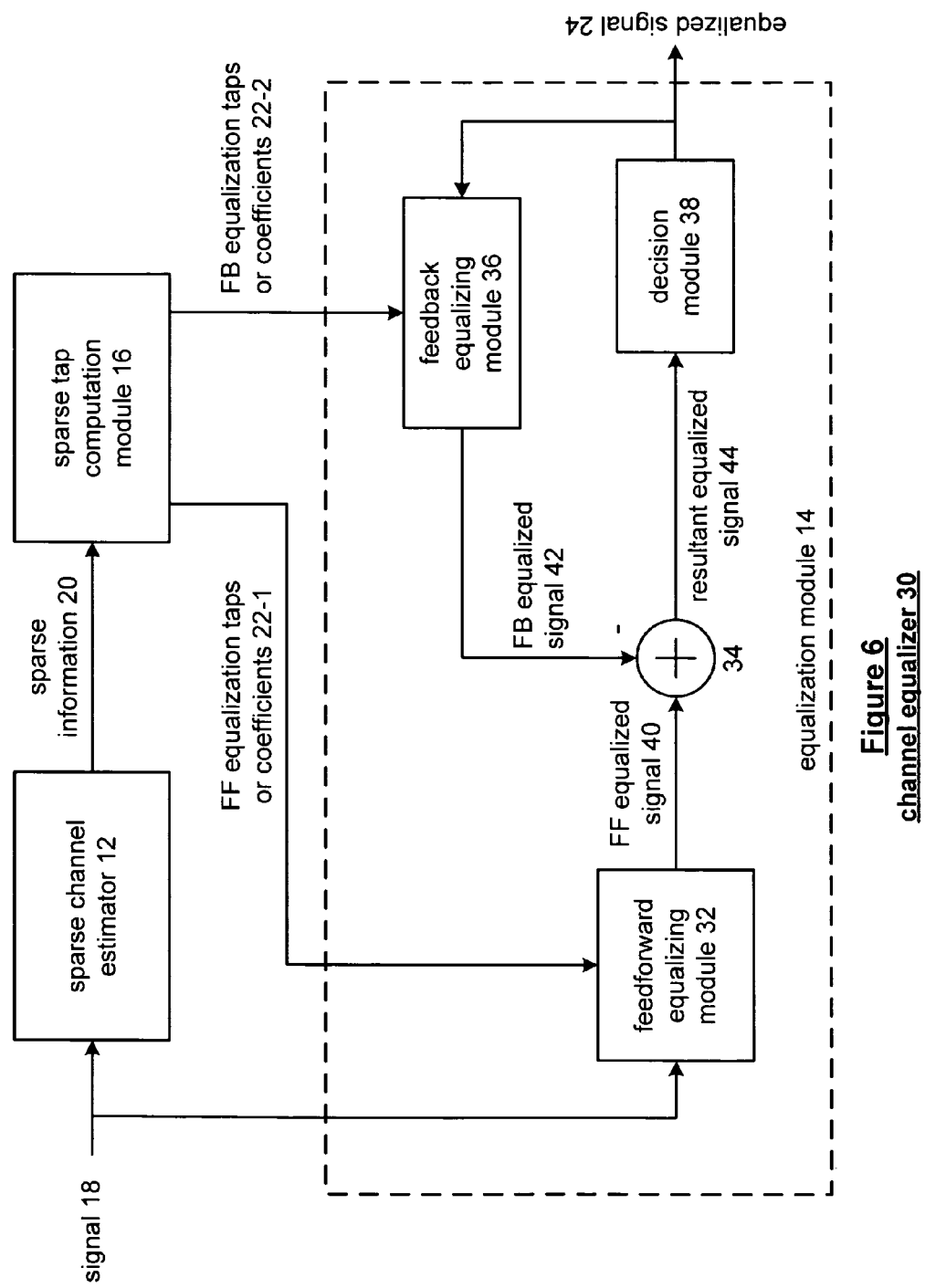
FIG. 6 is a schematic block diagram of another channel equalizer in accordance with the present invention.

FIG. 6 is a schematic block diagram of an alternate embodiment of a channel equalizer 30. The channel equalizer 30 includes the sparse channel estimator 12, the sparse tap computation module 16, and the equalization module 14. In this embodiment, the equalization module 14 is configured as a feedback equalizer and includes a feed-forward equalizing module 32, a subtraction module 34, a feedback equalizing module 36, and a decision module 38. The decision module 38 may function similarly to the decision module illustrated in the prior art equalizer of FIG. 4. Accordingly, the decision module may generate a hard-slicing decision and/or a soft-slicing decision.

The sparse tap computation module 16 generates feed-forward (FF) equalization taps 22-1 and feedback (FB) equalization taps 22-2 from the sparse information 20. The generation of the feed-forward and feedback equalization taps 22-1 and 22-2 will be described in greater detail with reference to FIG. 12.

The feed-forward equalizing module 32 receives the signal 18 and filters it based on the feed-forward equalization tap 22-1 to produce a feed-forward equalized signal 40. The feedback equalizing module 36 filters the outputted equalized signal 24 based on the feedback equalization taps 22-2 to produce a feedback equalized signal 42. The subtraction module 34 subtracts the feedback equalized signal 42 from the feed-forward equalized signal 40 to produce a resultant equalized signal 44. The decision module 38 operates on the resultant equalized signal 44 to produce the equalized signal 24.

Figure 7:
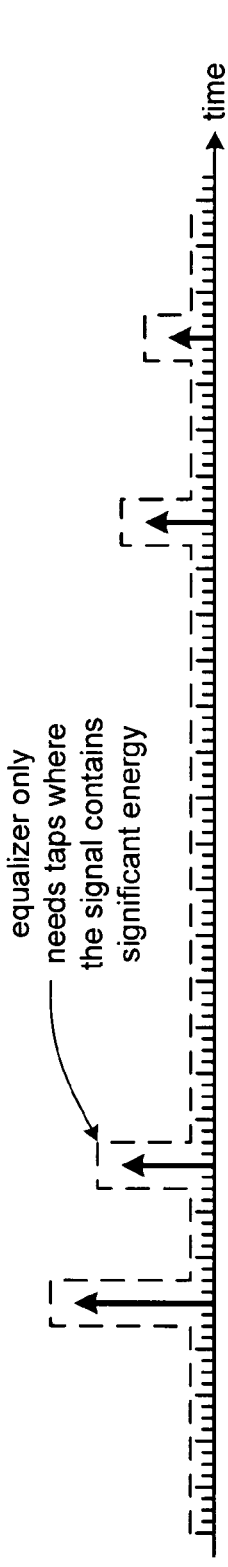
FIG. 7 is a graphical representation of a sparse channel in accordance with the present invention.

FIG. 7 is a graphical representation of a sparse channel in accordance with the present invention. In this illustration, a multiple path communication channel includes only 4 paths, which are indicated by the vertical arrowed lines. As is also shown, the energy of the multiple paths is separated in time by a relatively substantial amount. As such, between each energy pulse corresponding to the multiple path channel there are large amounts of insubstantial energy. Accordingly, the generation of the equalizer only needs to compensate for the channel where there is significant energy. Accordingly, where there is insignificant energy in the channel estimate, the corresponding taps of the equalizer may be zero. As such, a long filter for a sparse channel which may require thousands or tens-of-thousands of taps to accurately filter a multiple path channel, may only have 30-40 non-zero taps. Accordingly, the equalizer may be configured and hence constructed, to include a minimal number of multipliers (e.g., 30 to a couple of hundred) while still providing accurate channel estimation, tap computation, equalization for long filters.

Figure 8:
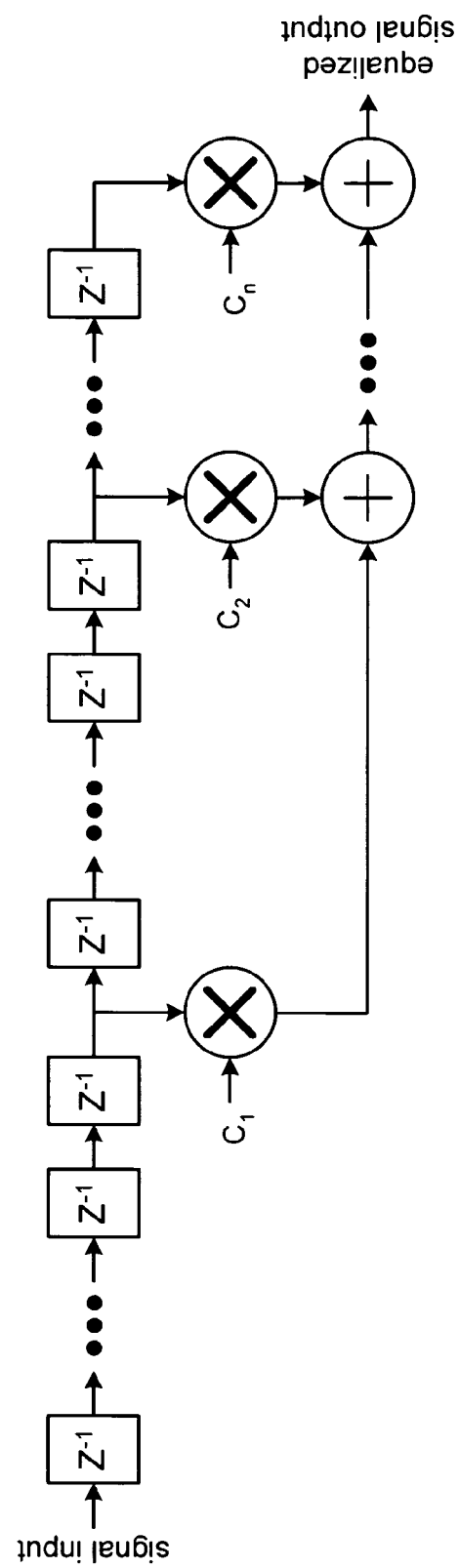
FIG. 8 is a schematic block diagram of an equalizing module in accordance with the present invention.

FIG. 8 is a schematic block diagram of an equalizing module 32 and/or 34 of FIG. 6. Note that if the channel equalizer 10 is implemented as a linear equalizer, the equalization module 14 may be implemented as illustrated in FIG. 8. In this illustration, the equalizing module includes a plurality of delay elements ($Z^{-1}$), a plurality of multipliers, and a plurality of adders. In this illustration, there are substantially less multipliers and adders than there are delay elements. In particular, the equalizing module may be configured to provide the multipliers and corresponding adders at non-zero taps of the equalizer. The zero taps are implemented by a delay block. For example, if the $1^{st}$ 100 taps of the filter have a zero coefficient, the equalizing module would begin with 100 delay elements before including a multiplier.

For the $1^{st}$ non-zero coefficient ($C_1$), the output of the corresponding delay element would be multiplied by the coefficient wherein the product of the multiplier would be summed with the next multiplication of a coefficient with the delay line.

Such an equalizing module may be configured based on the positioning of the non-zero equalizer taps. As such, such an equalizing module only requires a limited number of multipliers which, when implemented as an integrated circuit, substantially reduces the die area requirement in comparison to equalizers that have a multiplier for each tap. In addition, since a significant number of the taps are zero or negligible, the equalizer of the present invention suffers no, or little, loss in accuracy when computing the channel estimate, taps, and/or performing the equalization in comparison with equalizers that have multipliers for each tap. As one of average skill in the art will appreciate, the delay line may be tapped at any number of locations, based on the number of multipliers provided within the equalizer to achieve the equalization of a sparse channel in accordance with the present invention. Accordingly, the number of multipliers included within the equalizing module depends on the sparseness of the channel. The more sparse the channel, the less multipliers needed, and conversely, the less sparse the channel, the more multipliers needed.

Figure 9:
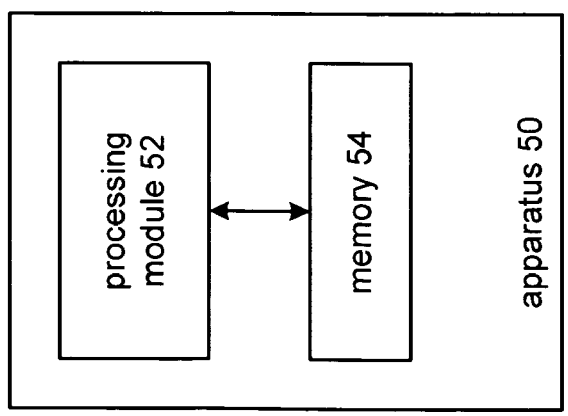
FIG. 9 is a schematic block diagram of an apparatus for sparse channel equalization in accordance with the present invention.

FIG. 9 is a schematic block diagram of an apparatus for sparse channel estimation and/or for equalizer coefficient determination from a sparse channel estimate. The apparatus 50 includes a processing module 52 and memory 54. The processing module 52 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 54 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 52 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 54 stores, and the processing module 52 executes, operational instructions corresponding to at least some of the steps and/or functions illustrated in FIGS. 10-12.

Figure 10:
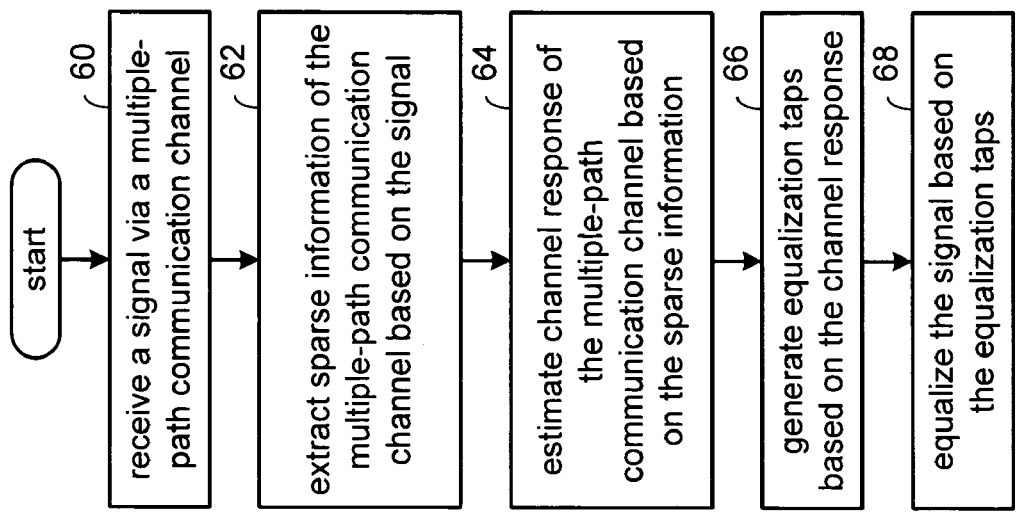
FIG. 10 is a logic diagram of a method for sparse channel equalization in accordance with the present invention.

FIG. 10 is a logic diagram of a method for sparse channel equalization. The method begins at Step 60 where a receiver receives a signal via a multiple path communication channel. The signal may be any RF signal and in particular may be a high-definition television signal. The process then proceeds to Step 62 where sparse information regarding the multiple path communication channel is extracted based on the signal. The extraction and/or determining of the sparse information may be done in a variety of ways. For instance, the sparse information may be determined from at least one training sequence, wherein, from the training sequence, channel taps of the multiple path communication channel that have an energy equal to or greater than an energy threshold are determined by a least squares algorithm and/or an adaptive filtering algorithm. Alternatively, the channel taps may be determined based on long term correlations of the training sequence, or sequences, with a known training sequence. Still further, the channel taps may be determined by iteratively correlating at least one training sequence with a known training sequence. Having done such a correlation, the channel taps are iteratively determined by ascertaining a correlation peak of the correlating of the training sequence with the known training sequence. Once the location of a channel tap is determined, it is removed from the training sequence to produce a modified training sequence. The modified training sequence is correlated with the known training sequence. Based on this subsequent correlation, another correlation peak is identified to determine a location of another channel tap. This iterative process of determining the channel taps continues until all of the channel taps have been determined.

The channel taps may still further be determined by determining their locations in accordance with a matching pursuit algorithm. Once the initial channel taps have been determined, they may be updated based on a data signal being received. As such, the sparse information (i.e., the determination of the energy peaks of the channel estimate), which was graphically illustrated in FIG. 7, are determined and may be subsequently updated as data is received via the multiple path communication channel.

The process then proceeds to Step 64 where the channel response of the multiple path communication channel is estimated based on the sparse information. The process then proceeds to Step 66 where equalization taps are generated based on the channel response. The equalization taps may be generated in a variety of ways. For example, the equalization taps may be generated by first determining non-zero, or non-insignificant, coefficients for the equalization taps based on the location of the channel taps. For zero, or insignificant coefficient values, no equalization taps are generated. To determine the non-zero coefficients, a sparse channel pre-echo location may be determined from the channel main tap of the multiple path communication channel. From there, the location of the non-zero coefficients is determined as multiples of integer linear combinations of the sparse channel pre-echo location. Accordingly, by knowing the pre-echo location, the location of other channel taps (i.e., those corresponding to other paths within the multiple path communication channel), are determined as integer multiples or combination of integer multiples of the pre-echo location.

Alternatively, the equalization taps may be generated by determining a set of coefficients for the entire filter corresponding to the multiple path communication channel. Each of these coefficients is then compared with the threshold. The resultant equalization taps are generated for the coefficients that compare favorably (e.g., greater than) the threshold. As such, all coefficients that fall below the threshold, are deemed to be insubstantial, and thus would be set to zero. The equalization taps may be generated for a feed-forward equalizer and/or for a feedback equalizer. The generation of feed-forward equalization taps and feedback equalization taps will be described in greater detail with reference to FIG. 12.

The generation of the equalization taps may be further performed by determining a number of channel taps of the multiple path communication channel (i.e., the number of channel taps in sparse channel estimate). Next, the number of channel taps is compared with a hardware limitation of equalization taps (e.g., how many multipliers are available for the equalizer). When the number of channel taps exceeds the hardware limitation of equalization taps, the equalization taps are selected for certain ones of the channel taps to provide a best case channel equalization. For example, the equalization taps may correspond to the channel taps of greatest magnitude.

The process of generating the equalization taps may be further expanded by determining two sets of channel taps of the multiple path communication channel. The $1^{st}$ set of channel taps corresponds to energy peaks that exceed a $1^{st}$ threshold. The $2^{nd}$ set of channel taps corresponds to energy peaks that are above a $2^{nd}$ energy threshold but below the $1^{st}$. In this grouping of channel taps, equalization taps of the equalizer are generated only for the channel taps in the $1^{st}$ set (i.e., the channel taps having an energy level greater than the $1^{st}$ energy level threshold). During operation of the receiver, the $2^{nd}$ set of channel taps are monitored to determine whether any of the channel taps have their energy level increased above the $1^{st}$ energy level threshold. When this occurs, an equalization tap is generated for the channel tap in the $2^{nd}$ set having its energy level greater than the $1^{st}$ energy level threshold. In addition, the $1^{st}$ set of channel taps is monitored to determine whether energy of any one of the channel taps drops below the $1^{st}$ energy level threshold. When this occurs, the equalization tap may be removed for this particular channel tap. Accordingly, the generation of the equalization taps may be a dynamic process that updates regularly based on changes in the sparse channel estimate. Furthermore, the two different sets of taps could be adapted or monitored using two different adaptive step-sizes and/or error signals.

The process then proceeds to Step 68 where the signal is equalized based on the equalization taps. Accordingly, the equalization removes, or substantially removes, the adverse effects induced by the channel thus removing the adverse effects of the multiple paths. As such, by utilizing such a method to equalize a sparse channel, an equalizer is obtained that performs accurate channel estimation, tap computation and equalization while substantially reducing the number of multipliers required for such long filters.

Figure 11:
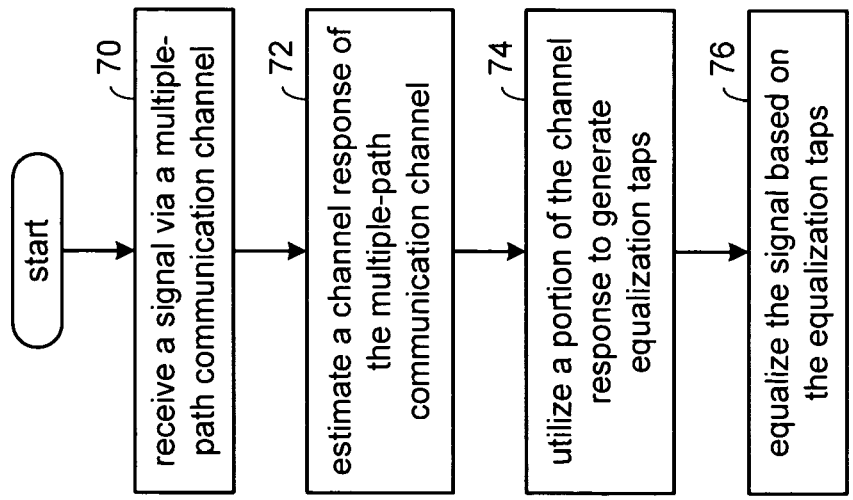
FIG. 11 is a logic diagram of an alternate method for sparse channel equalization in accordance with the present invention.

FIG. 11 is a logic diagram of an alternate method for sparse channel equalization. The method begins at Step 70 where a signal is received via a multiple path communication channel. The signal may be any RF signal including high-definition television broadcast. The process then proceeds to Step 72 where a channel response of the multiple path communication channel is estimated. This may be performed as previously described with reference to Steps 62 and 64 of FIG. 10.

The process then proceeds to Step 74 where a portion of the channel response is used to generate equalization taps. This may be done in a variety of ways. For instance, channel taps of the channel response that have an energy equal to or greater than an energy threshold are determined. Once the channel taps are determined, equalization taps are generated for the channel taps. The channel taps may be determined by identifying their locations based on a long term correlation of at least one training sequence with a known training sequence. Alternatively, the channel taps may be determined on an iterative basis by correlating the training sequence or sequences with a known training sequence to identify correlation peak. This correlation peak is used to identify the location of one channel tap. Once this channel tap is identified, it is removed from the channel estimate and a subsequent correlation is performed to identify another correlation peak. This correlation peak is used to determine the location of another channel tap. The iterative process is continued until each of the channel taps is identified. As yet a further alternative, the channel taps may be determined by performing a matching pursuit algorithm.

The process then proceeds to Step 76 where the signal is equalized based on the equalization taps. Accordingly, the equalization removes, or substantially removes, the adverse effects induced by the channel thus removing the adverse effects of the multiple paths. As such, by utilizing such a method to equalize a sparse channel, an equalizer is obtained that performs accurate channel estimation, tap computation and equalization while substantially reducing the number of multipliers required for such long filters.

Figure 12:
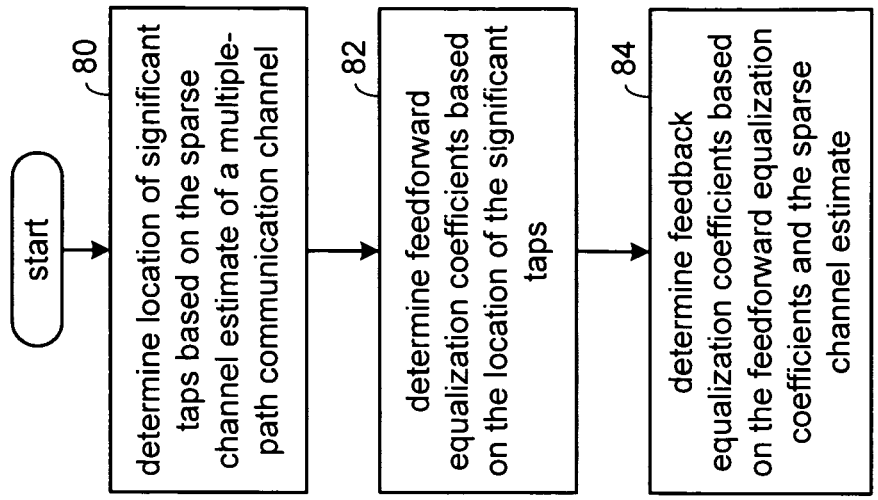
FIG. 12 is a logic diagram of a method for determining coefficients of a decision feedback equalizer from a sparse channel estimate in accordance with the present invention.

FIG. 12 is a logic diagram of a method for determining coefficients of a decision feedback equalizer from a sparse channel estimate. The process begins at Step 80 where location of significant taps is determined based on a sparse channel estimate of a multiple path communication channel. This may be done in a variety of ways. For example, a feed-forward tap computation may be performed in accordance with a delay line having a predetermined length to produce a plurality of taps. In other words, a feed-forward tap computation is performed on a long filter to identify all of the taps of the filter. The determination then continues by comparing energy level, or values, of each of the plurality of taps with a threshold. The processing continues by determining the location of the significant taps based on the comparing of the energy level of each tap with the threshold, where the significant taps are ones that compared favorably with the threshold. In a sparse multiple path communication channel, the number of significant taps should be substantially less than the predetermined length of the delay line.

The performance of the feed-forward tap computation may be done by performing a limited finite precision feed-forward tap computation to generate the plurality of taps, where each of the plurality of taps have a course coefficient value. In other words, the determination of the significant taps may be done with a very limited precision feed-forward tap computation since the exact value is not the desired outcome but just their location. Note that the feed-forward tap computation may be performed as described in co-pending patent application entitled FAST COMPUTATION OF DECISION FEEDBACK EQUALIZER COEFFICIENTS, having a filing date of Oct. 26, 2001, and a patent application Ser. No. 10/044,013, which is incorporated herein by reference in its entirety.

The process then proceeds to Step 82 where feed-forward equalization coefficients are determined based on the location of the significant taps. This may be done in a variety of ways. For instance, a least squares computation may be performed on the sparse channel estimate to obtain the feed-forward equalization coefficients. Such a least squares computation may be done by performing a fast transversal filter algorithm, or performing an Orthogonal-triangular decomposition (QR decomposition) fast transversal filtering algorithm. The fast transversal filtering algorithm includes performing iterations of the fast transversal filtering for non-zero coefficients of the feed-forward equalization coefficients. Such fast transversal filtering may be done in accordance with the above-referenced co-pending patent application.

The process then proceeds to Step 84 where feedback equalization coefficients are determined based on the feed-forward equalization coefficients and the sparse channel estimate. This may be done in a variety of ways. For example, the feedback equalization coefficients may be determined by performing a convolution of the sparse channel estimate with the feed-forward equalization coefficients. The convolution may be done by performing a fast-Fourier transform on the sparse channel estimate and the feed-forward equalization coefficients. By calculating the feed-forward and feedback equalizer coefficients in this manner, a high performance equalizer is achieved that accurately performs channel estimations, tap computations and equalization for long filters while reducing the number of multipliers required for such filtering.

Figure 13:
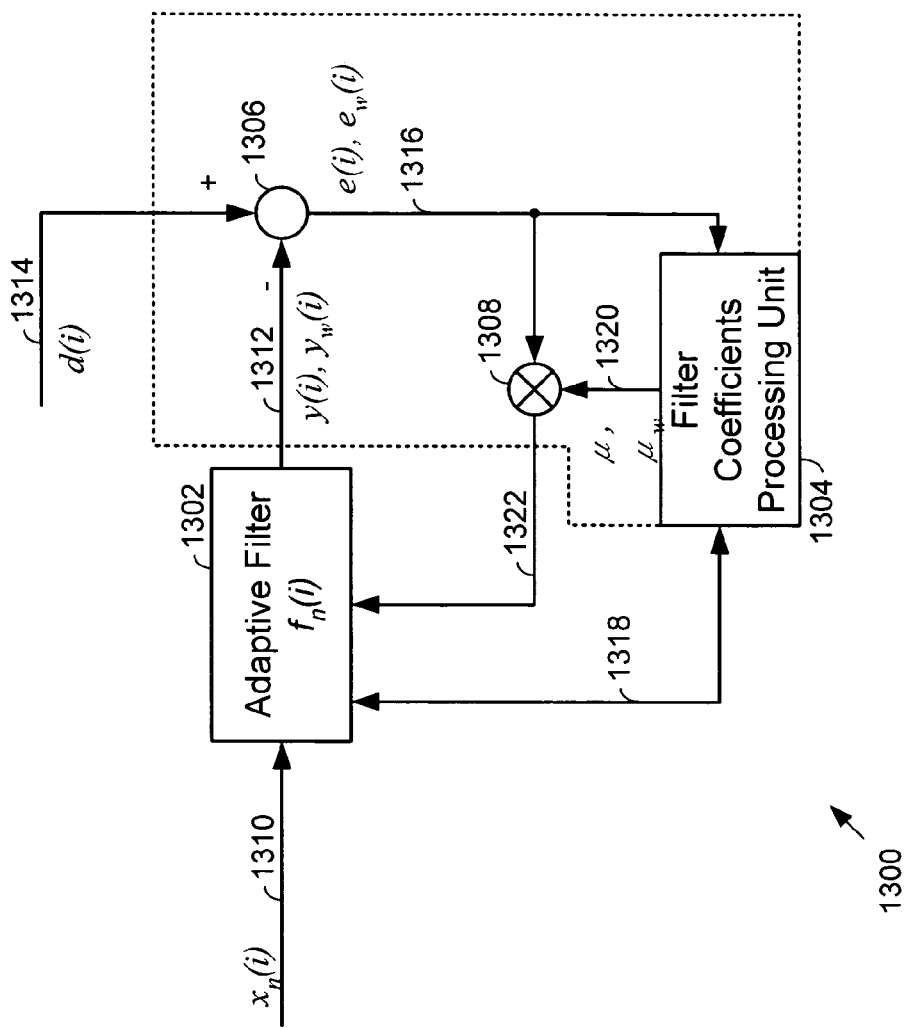
FIG. 13 is a block diagram illustrating a communication system filter constructed according to the present invention.

FIG. 13 is a block diagram illustrating a communication system filter constructed according to the present invention. The communication system filter includes an adaptive filter 1302 that may be any type of filter that is trained for subsequent use (or concurrent use) in filtering communication signals and a filter coefficients processing unit 1304. The adaptive filter 1302 may be any of a linear equalizer, e.g., Finite Impulse Response (FIR) filter, a FFE of a DFE, a FBE of a DFE, both the FFE and FBE of a DFE, or another type of communication system filter. Each of these types of filters is described hereinafter as an "adaptive filter" 1302. After the adaptive filter 1302 is trained, it may be used to equalize an incoming signal to remove channel effects or other undesired components, e.g., ingress, burst noise, etc.

Generally, the adaptive filter 1302 is trained by the filter coefficients processing unit 1304. The filter coefficients processing unit 1304 may be implemented within a processing unit, e.g. controller, microprocessor, or another processing device present in a communications transceiver or support chip thereof, a stand-alone component of the communications transceiver, or a combination of these components. Training of the adaptive filter 1302 is performed using a Least Mean Squares (LMS) algorithm, a modified LMS algorithm, or another iterative technique. As shown, summer 1306 and multiplier 1308 may form part of the filter coefficients processing unit 1304.

A receive signal $x_n(i)$ 1310 inputs to the adaptive filter 1302. In response to the receive signal $x_n(i)$ 1310, the adaptive filter 1302 produces an output 1312. When equalizing/filtering an incoming signal for subsequent data recovery, the adaptive filter 1302 produces a single output 1312. However, according to operation of the present invention, for adaptive filter training operations, the adaptive filter 1302 produces two separate outputs, a first filter output $y_w(i)$ and a second filter output $y(i)$. The first filter output $y_w(i)$ is produced in response to the receive signal $x_n(i)$ 1310 using a first group of filter coefficients of a plurality of filter coefficients $f_n(i)$ of the adaptive filter 1302. The second filter output $y(i)$ is produced in response to the received signal $x_n(i)$ 1310 using all of the plurality of filter coefficients $f_n(i)$ of the adaptive filter 1302. The first filter output $y_w(i)$ and the second filter output $y(i)$ are referenced together via numeral 1312.

The received signal $x(n)$ 1310, in many operations, is a preamble or training sequence having a known data format at the time of its transmission. Thus, the expected output $d(i)$ 1314 is an expected version of the transmitted preamble or training sequence. The summation block 1306 produces a first error signal $e_w(i)$ and a second error signal $e(i)$, together referenced as numeral 1316, based upon the first filter output $y_w(i)$ and the second filter output $y(i)$ and the expected output $d(i)$ 1314. The summation block 1306 subtracts the first filter output $y_w(i)$ from the expected output $d(i)$ 1314 to produce the first error signal error signal $e_w(i)$. The summation block 1306 subtracts the second filter output $y(i)$ from the expected output $d(i)$ 1314 to produce the second error signal error signal $e(i)$.

Every Nth iteration, the filter coefficients processing unit 1304 determines a first step size $\mu_w$, and a second step size $\mu$ for subsequent use in alerting the filter coefficients $f_n(i)$ of the adaptive filter 1302. The filter coefficients processing unit 1304 tracks the plurality of filter coefficients $f_n(i)$ of the adaptive filter 1302 and other required information via link 1318 and uses this information to determine the first step size $\mu_w$, and the second step size $\mu$. The filter coefficients processing unit 1304 uses the filter coefficients $f_n(i)$, the multiplier 1308, the first error signal $e_w(i)$, second error signal $e(i)$, the first step size $\mu_w$, and the second step size $\mu$ to produce altered filter coefficients 1322 during each iteration while training the adaptive filter 1302. The manner in which the adaptive filter is trained is described further with reference to FIGS. 14, 15, and 16.

Figure 14:
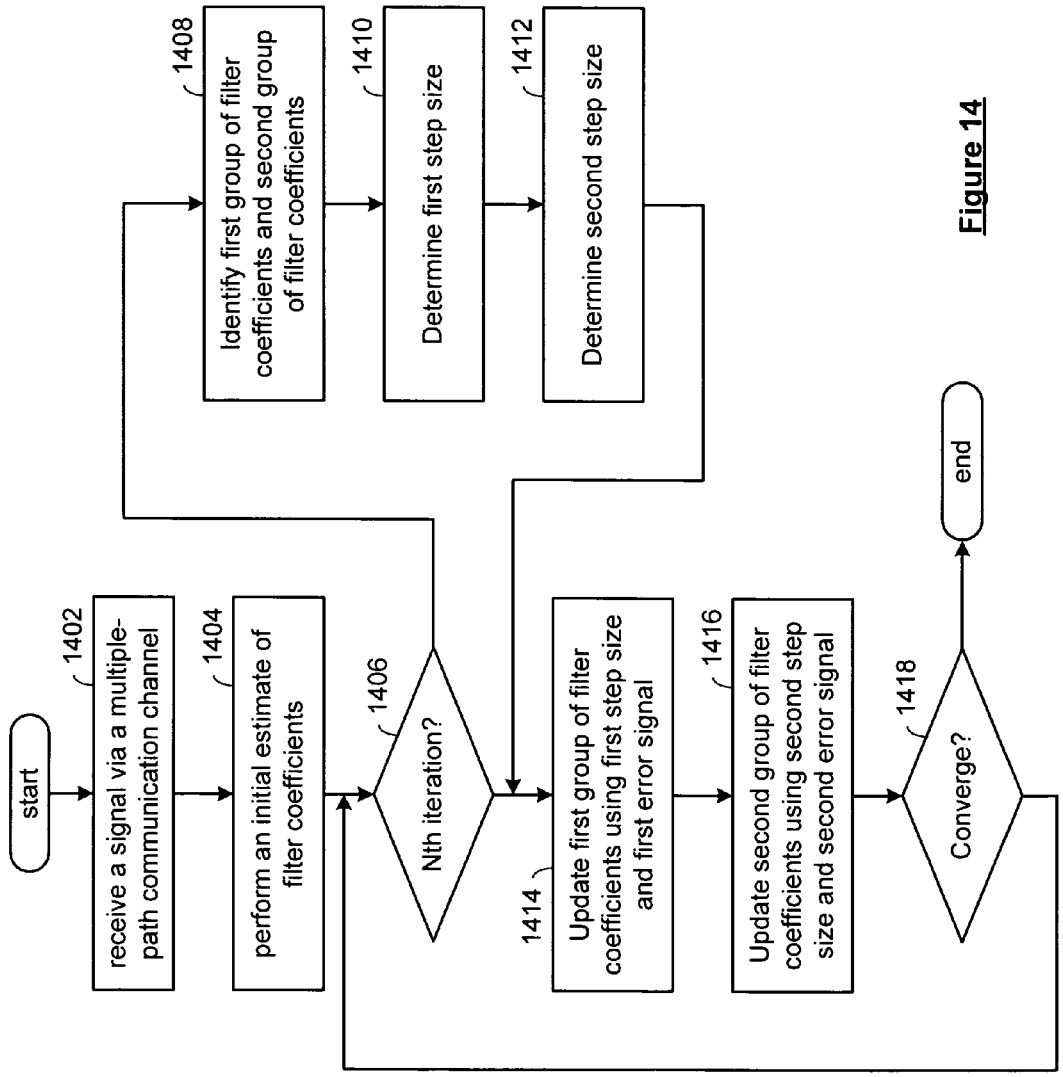
FIG. 14 is a flow chart illustrating a method for training the communication system filter of FIG. 13 according to the present invention.

FIG. 14 is a flow chart illustrating a method for training the communication system filter of FIG. 13 according to the present invention. Operation commences in receiving a signal via a multiple path communication channel (1402). The operations of FIGS. 14-16 and the communication system filter of FIG. 13 work particularly well for sparse channel filtering/equalizing, such as was previously with reference to FIGS. 1-12. Operation continues with performing initial estimate of a plurality of filter coefficients of the communication system filter (Step 1404). The initial estimate of the plurality of filter coefficients may be determined by assuming a plurality of default filter coefficient values. Alternately, the initial estimate may be based upon the received signal to arrive at a better starting point for the filter coefficients.

As was previously described with reference to FIG. 13, and as will be described with reference to FIGS. 14-16, $f_n(i)$ denotes the $n^{th}$ coefficient of the adaptive filter at the $i^{th}$ time instant. The adaptive filter 1302 consists of N coefficients. The input 1302 to the adaptive filter 1310 is the data sample $x_n(i)$ and the expected output 1314 is $d(i)$ at the $i^{th}$ time instant. Operation continues in determining whether the current iteration to alter the plurality of filter coefficients of the communication filter is the $N^{th}$ iteration (Step 1406). The operation of FIG. 14 uses an LMS procedure for adapting the adaptive filter 1302 to a converged solution. With such iterative operation, the adaptive filter 1302 is trained based upon the preamble or training sequence of the received signal, i.e., the expected output $d(i)$ 1314.

If the current iteration of training the adaptive filter 1302 is the $N^{th}$ iteration, a first group of filter coefficients and a second group of filter coefficients are determined (Step 1408). As will be described further with reference to FIGS. 15 and 16, a windowing function may be employed to identify and track the first group of filter coefficients and the second group of filter coefficients. Operation continues with determining a first step size $\mu_w$ that will be subsequently used with the first group of filter coefficients (Step 1410). Then, a second step size $\mu$ is determined that will be used in altering the second group of filter coefficients (Step 1412).

For stability of the adaptive filter 1302, the step size has to be less than the following value:

$$\mu < \frac{2}{N \cdot \sigma_x^2} \quad \text{Equation (9)}$$

where N is the adaptive filter length and $\sigma_x^2$ is the input signal power.

Thus, the maximum step size is inversely proportional to the filter length N. For long channels, such as HDTV channels, the value of N is quite large. Using prior techniques, this long channel length forces the use of a relatively small step size. Such small step size degrades the tracking performance of prior adaptive filters. In other words, the adaptive filter coefficients cannot track fast variations in a channel. This is due to the small step size it takes in any given direction.

According to the present invention, two step sizes are determined. The first step size $\mu_w$ is inversely proportional to the number of filter coefficients in the first group of filter coefficients. The second step size $\mu$ is inversely proportional to the adaptive filter length N or, alternately, inversely proportional to the number of filter coefficients in the second group of filter coefficients.

From step 1412 and from a negative determination at Step 1406, operation continues in updating the first group of filter coefficients using the first step size $\mu_w$ and a first error signal $e_w(i)$ (Step 1414). Operation continues in updating the second group of filter coefficients using the second step size $\mu$ and the second error signal $e(i)$ (Step 1416). Then, a determination is made as to whether convergence has been met in training the adaptive filter 1302 (step 1418). If convergence has not been met by the completed iteration, operation continues to Step 1406 where iteration is continued. However, if the iterative algorithm has converged, operation ends.

Figure 15:
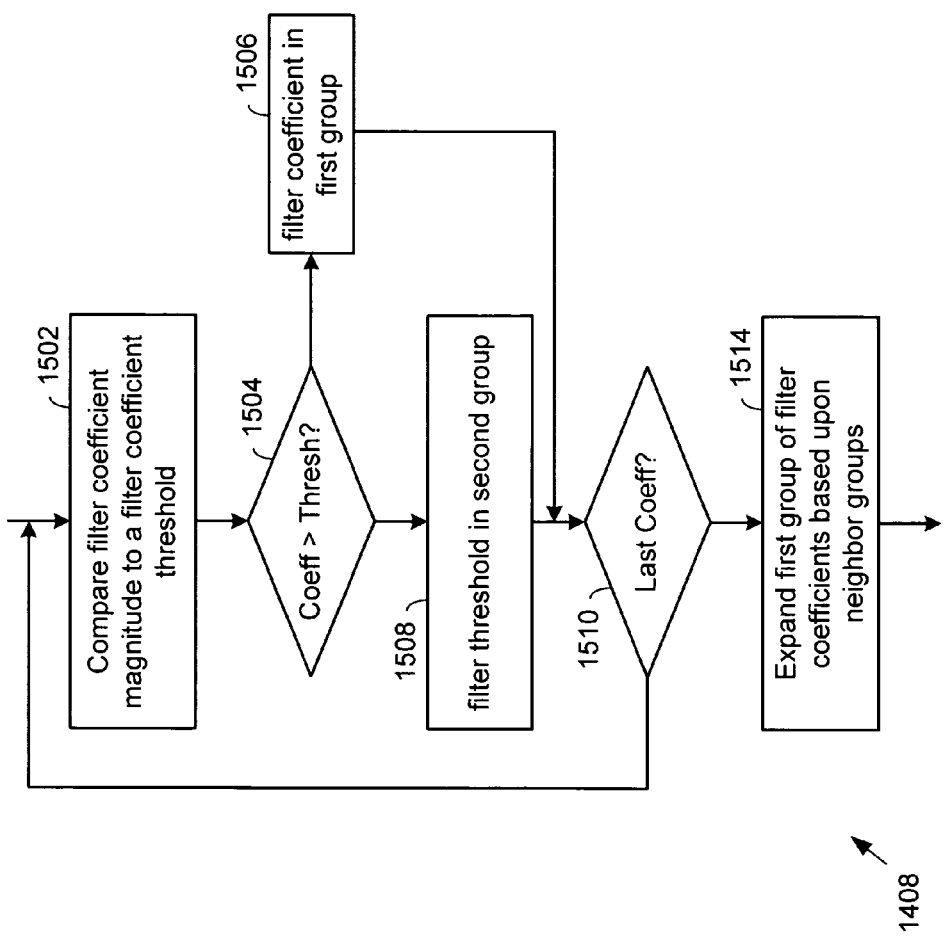
FIG. 15 is a flow chart illustrating one embodiment of step 1408 of FIG. 14.

FIG. 15 is a flow chart illustrating one embodiment of step 1408 of FIG. 14. The embodiment of step 1408 of FIG. 15 includes first comparing a particular filter coefficient magnitude to a filter coefficient threshold (Step 1502). If the coefficient magnitude is greater than the threshold (as determined at Step 1504), the filter coefficient is assigned to the first group of filter coefficients (Step 1506). However, if the magnitude of the filter coefficient is not greater than the threshold (as determined at Step 1504) the filter coefficient is assigned to the second group of filter coefficients (Step 1508).

For bookkeeping purposes, a binary window sequence $w_n(i)$ may be defined that has an entry for each filter coefficient $f_n(i)$. Every Nth iteration, the binary window sequence $w_n(i)$ is set according to the following:

$$\text{if } |f_n(i)| > \delta, \text{ then } w_n(i)=1, \text{ else } w_n(i)=0, n=1,2,\ldots,L \quad \text{Equation (10)}$$

Thus, every N iterations, the coefficients of the adaptive filter are compared to a threshold $\delta$ to decide if whether the coefficient belongs to the first group of filter coefficients (having significant energy) or to the second group of filter coefficients (having less than significant energy). If the $n^{th}$ coefficient is greater than the threshold, the corresponding element of the binary window sequence $w_n(i)$ is set to one and the filter coefficient is within the first group of filter coefficients. Otherwise, the corresponding element of the binary window sequence $w_n(i)$ is set to zero and the filter coefficient is within the second group of filter coefficients.

If the currently considered filter coefficient is not the last coefficient (as determined at Step 1510) operation returns to Step 1502 to consider the next filter coefficient. However, if the currently considered filter coefficient is the last coefficient (as determined at Step 1510) operation continues to Step 1514. At Step 1514, the first group of filter coefficients is expanded based upon the value of filter coefficients within a neighbor group. In such case, filter coefficients are assigned to the first group of filter coefficients when their magnitude does not exceed the threshold but when at least on coefficient within a neighbor group of filter coefficients exceeds the threshold value. One technique for performing this operation is to widen the window sequence to form contiguous groups of window sequence elements according to the following:

$$\text{if } \sum_{n-G}^{n+G} w_n(i) > 0, \text{ then } w_n(i) = 1, \quad \text{Equation (11)}$$

$$\text{else } w_n(i) = 0, n = 1,2,\ldots,L$$

Figure 16:
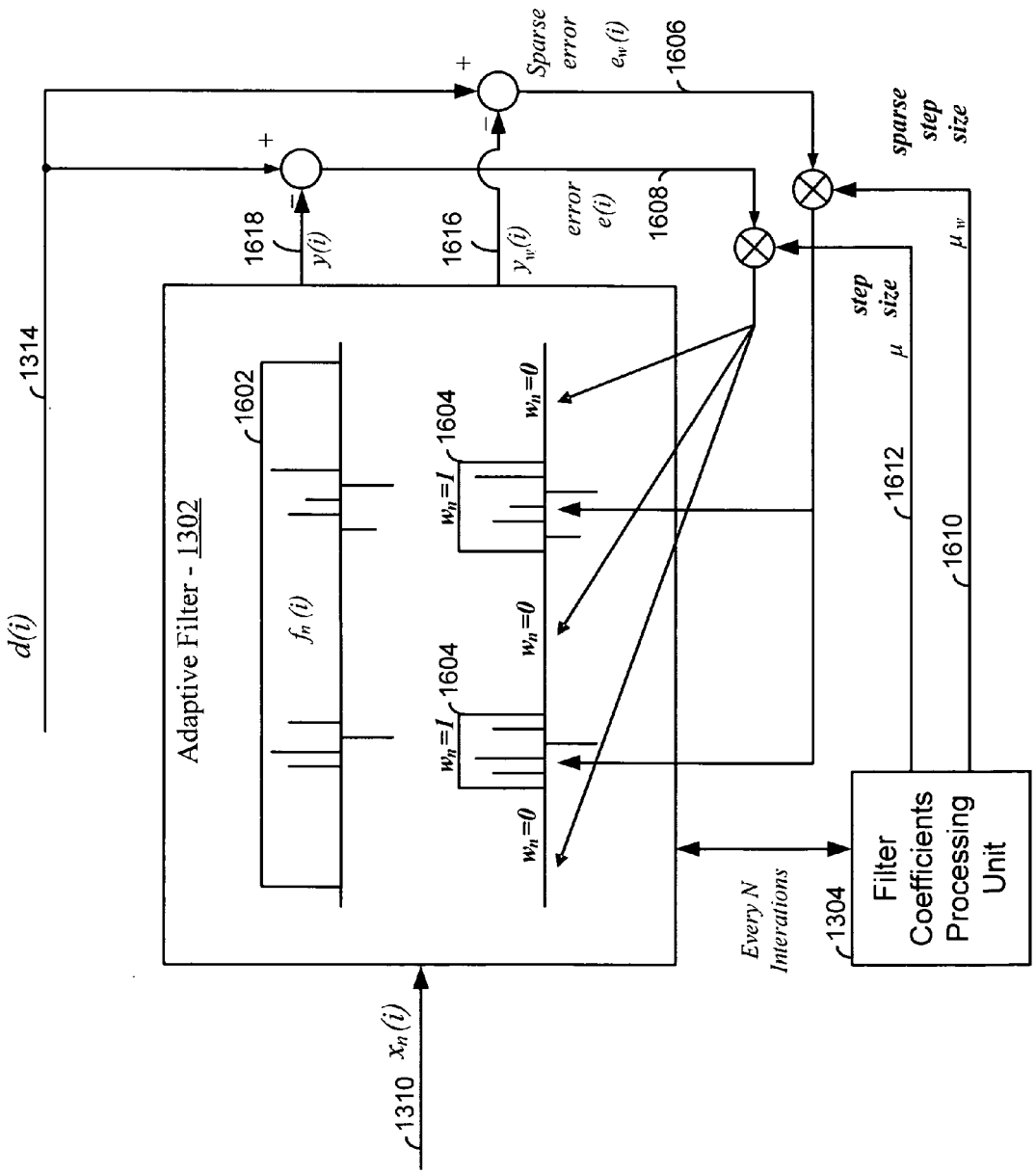
FIG. 16 is a block diagram illustrating the manner in which the adaptive filter coefficients are updated according to the present invention using a windowing function.

FIG. 16 is a block diagram illustrating the manner in which the adaptive filter 1302 coefficients are updated according to the present invention using a windowing function. The adaptive filter 1302 includes the plurality of filter coefficients $f_n(i)$ 1602. As is shown, the windowing function $w_n(i)$ has a value of 1 (inside the window 1604) when the magnitude of a particular filter coefficient exceeds a filter coefficient threshold or when a neighbor group criteria is satisfied. As is shown, the windowing function $w_n(i)$ has a value of 0 (outside the window 1604) when the magnitude of a particular filter coefficient does exceed a filter coefficient threshold and when a neighbor group criteria is not satisfied.

The first step size $\mu_w$ 1610, also referred to as the sparse step size, is used for modifying the filter coefficients of the first group of filter coefficients. Likewise, the second step size $\mu$ 1612 is used for modifying the filter coefficients within the second group of filter coefficients. As previously described, the first step size $\mu_w$ is inversely proportional to the number of filter coefficients in the first group of filter coefficients while the second step size $\mu$ is inversely proportional to the adaptive filter length N. The first step size and the second step size may be generated based on the window sequence $w_n(i)$. In such case, the first step size $\mu_w$ 1610 is inversely proportional to the number of non-zero elements in $w_n(i)$. In other words, if there is a small number of non-zero elements in $w_n(i)$, $\mu_w$ is increased (to a higher value than $\mu_{max}$). This step size is used to update the filter coefficients inside the window 1604 (corresponding to $w_n(i)=1$) at step 1414. A much smaller step size $\mu$ (much smaller than $\mu_{max}$) 1610 is chosen to update the filter coefficients outside the window 1604 (corresponding to $w_n(i)=0$).

The operations at both steps 1414 and 1416 of FIG. 14 employ the same LMS technique but with differing step sizes and error signals. In both cases, the adaptive filter 1302 output is subtracted from the desired response to form the error signal given by the general equation:

$$e(i) = d(i) - \sum_{n=1}^{N} f_n(i)x_n(i) \qquad \text{Equation (12)}$$

The error signal is then used to update the adaptive filter coefficients using the general LMS algorithm, given by:

$$f_n(i+1) = f_n(i) + \mu e(i)x_n(i) \qquad \text{Equation (13)}$$

where $\mu$ is the step-size.

However, according to the present invention, at every time instant (iteration), two outputs of the adaptive filter 1302 are computed. The first filter output, $y_w(i)$ 1616, is the contribution of the significant coefficients only (corresponding to $w_n(i)=1$) and may be computed according to:

$$y_w(i) = \sum_{n=1}^{L} f_n(i) \cdot x_n(i) \cdot w_n(i) \qquad \text{Equation (14)}$$

The second filter output, $y(i)$ 1618, is the contribution of all the filter coefficients and may be computed according to:

$$y(i) = \sum_{n=1}^{L} f_n(i) \cdot x_n(i) \qquad \text{Equation (15)}$$

Further, two error signals are computed. The first error signal 1606 may be computed as follows:

$$e_w(i) = d(i) - y_w(i) \qquad \text{Equation (16)}$$

The second error signal 1608 may be computed as follows:

$$e(i) = d(i) - y(i) \qquad \text{Equation (17)}$$

A dual error LMS update may then be carried according by the present invention by: (1) in updating the filter coefficients of the first group of filter coefficients using the first error signal and the first step size according to:

For $n=1, 2, \ldots, L$:

$$f_n(i+1) = f_n(i) + \mu_w e_w(i)x_n(i), \text{ for } w_n(i)=0 \qquad \text{Equation (18)}$$

and (2) in updating the filter coefficients of the second group of filter coefficients using the second error signal and the second step size according to:

For $n=1, 2, \ldots, L$:

$$f_n(i+1) = f_n(i) + \mu e(i)x_n(i), \text{ for } w_n(i)=1, \qquad \text{Equation (19)}$$

By performing the dual error signal/dual step size adaptation, convergence of the adaptive filter 1302 may be achieved for sparse channels that may vary fairly rapidly. This technique may be extended to more than two groups of filter coefficients/filter outputs/error signals in a straightforward manner.

The preceding discussion has presented a method and apparatus for sparse channel equalization and determining coefficients thereof. By leveraging the sparse nature of a multiple path communication channel, the hardware requirements for implementing an equalizer may be reduced and implemented in a configurable manner to obtain an equalizer that performs accurate channel estimation, tap computation, and equalization for long filters while substantially reducing the number of multipliers needed to implement such filtering. As one of average skill in the art will appreciate, other embodiments may be derived from the teaching of the present invention without deviating from the scope of the claims.

The invention claimed is:

1. A method for training a communication system filter comprising:

performing an initial estimate of a plurality of filter coefficients of the communication system filter; and based upon an output produced by the communication system filter in response to a received signal and an expected output of the communication system filter, iterating to alter the plurality of filter coefficients of the communication system filter by:

every Nth iteration, identifying a first group of filter coefficients of the plurality of filter coefficients that satisfy filter coefficient threshold rules and a second group of filter coefficients of the plurality of filter coefficients that do not satisfy the filter coefficient threshold rules by:

comparing the magnitude of each filter coefficient of the plurality of filter coefficients to a filter coefficient threshold value;

when the magnitude of a filter coefficient exceeds the filter coefficient threshold value, assigning the filter coefficient to the first group of filter coefficients; and when the magnitude of the filter coefficient does not exceed the filter coefficient threshold value, assigning the coefficient to the second group of filter coefficients; and every iteration:

updating the first group of filter coefficients using a first step size and a first error signal; and updating the second group of filter coefficients using a second step size and a second error signal.

2. The method of claim 1, further comprising assigning the filter coefficient to the first group of filter coefficients when the magnitude of at least one filter coefficient within a neighbor group of filter coefficients exceeds the threshold value.

3. The method of claim 1, wherein performing an initial estimate of the plurality of filter coefficients of the communication system filter comprises assigning a plurality of default filter coefficients.

4. The method of claim 1, wherein performing an initial estimate of the plurality of filter coefficients of the communication system filter comprises using the received signal to assign a plurality of estimated filter coefficients.

5. The method of claim 1, farther comprising, every Nth iteration:
determining the first step size so that it is inversely proportional to a number of filter coefficients in the first group of filter coefficients; and
determining the second step size.

6. The method of claim 5, wherein the second step size is inversely proportional to one of:
a number of filter coefficients in the second group of filter coefficients; and
a number of the plurality of filter coefficients.

7. The method of claim 1 wherein:
updating the first group of filter coefficients using the first step size and the first error signal includes:
determining a first filter output in response to the received signal by using only the first group of filter coefficients; and
determining the first error signal based upon the first filter output and the expected output; and
updating the second group of filter coefficients using the second step size and the second error signal:
determining a second filter output in response to the received signal using all of the plurality of filter coefficients; and
determining the second error signal based upon the second filter output and the expected output.

8. The method of claim 1, wherein the communication system filter is one of a linear equalizer, a portion of a decision feedback equalizer, and a decision feedback equalizer.

9. The method of claim 1, wherein the iterating is performed using one of a Least Mean Squares (LMS) algorithm and a modified LMS algorithm.

10. A method for training a communication system filter comprising:
performing an initial estimate of a plurality of filter coefficients of the communication system filter; and
iterating to alter the plurality of filter coefficients of the communication system filter by:
every Nth iteration:
identifying a first group of filter coefficients of the plurality of filter coefficients that satisfy filter coefficient threshold rules and a second group of filter coefficients that do not satisfy the filter coefficient threshold rules by:
comparing the magnitude of each filter coefficient of the plurality of filter coefficients to a filter coefficient threshold value;
when the magnitude of a filter coefficient exceeds the filter coefficient threshold value, assigning the filter coefficient to the first group of filter coefficients; and
when the magnitude of the filter coefficient does not exceed the filter coefficient threshold value, assigning the coefficient to the second group of filter coefficients;
determining a first step size that it is inversely proportional to a number of filter coefficients in the first group of filter coefficients; and
determining a second step size; and
every iteration:
determining a first filter output in response to the received signal using only the first group of filter coefficients;
determining a first error signal based upon the first filter output and an expected output;
updating the first group of filter coefficients using upon the first step size and the first error signal;
determining a second filter output in response to the received signal using all of the plurality of filter coefficients;
determining a second error signal based upon the second filter output and the expected output; and
updating the second group of filter coefficients using the second step size and the second error signal.

11. The method of claim 10, further comprising assigning the filter coefficient to the first group of filter coefficients when the magnitude of at least one filter coefficient within a neighbor group of filter coefficients exceeds the threshold value.

12. The method of claim 10, wherein performing an initial estimate of the plurality of filter coefficients of the communication system filter comprises assigning a plurality of default filter coefficients.

13. The method of claim 10, wherein performing an initial estimate of the plurality of filter coefficients of the communication system filter comprises using the received signal to assign a plurality of estimated filter coefficients.

14. The method of claim 1, further comprising, every Nth iteration:
determining the first step size so that it is inversely proportional to a number of filter coefficients in the first group of filter coefficients; and
determining the second step size.

15. The method of claim 14, wherein the second step size is inversely proportional to one of:
a number of filter coefficients in the second group of filter coefficients; and
a number of the plurality of filter coefficients.

16. The method of claim 10, wherein the communication system filter is one of a linear equalizer, a portion of a decision feedback equalizer, and a decision feedback equalizer.

17. The method of claim 10, wherein the iterating is performed using one of a Least Mean Squares (LMS) algorithm and a modified LMS algorithm.

18. A communication system filter comprising:
an adaptive filter having a plurality of filter coefficients that produces an output in response to a received signal; and
a filter coefficients processing unit operable to cause adaptive filter training of the adaptive filter, the filter coefficients processing unit operable to iterate to alter the plurality of filter coefficients of the communication system filter by:
every Nth iteration, identifying a first group of filter coefficients of the plurality of filter coefficients that satisfy filter coefficient threshold rules and a second group of filter coefficients of the plurality of filter coefficients that do not satisfy the filter coefficient threshold rules by:

comparing the magnitude of each filter coefficient of the plurality of filter coefficients to a filter coefficient threshold value;

when the magnitude of a filter coefficient exceeds the filter coefficient threshold value, assigning the filter coefficient to the first group of filter coefficients; and when the magnitude of the filter coefficient does not exceed the filter coefficient threshold value, assigning the coefficient to the second group of filter coefficients; and every iteration:

updating the first group of filter coefficients using a first step size and a first error signal; and updating the second group of filter coefficients using a second step size and a second error signal.

19. The communication system filter of claim 18, wherein the filter coefficients processing unit is further operable to assign the filter coefficient to the first group of filter coefficients when the magnitude of at least one filter coefficient within a neighbor group of filter coefficients exceeds the threshold value.

20. The communication system filter of claim 18, wherein every Nth iteration, the filter coefficients processing unit is operable to:

determine the first step size so that it is inversely proportional to a number of filter coefficients in the first group of filter coefficients; and determine the second step size.

21. The communication system filter of claim 18, wherein every Nth iteration, the filter coefficients processing unit is operable to:

determine the first step size so that it is inversely proportional to a number of filter coefficients in the first group of filter coefficients; and determine the second step size so that it is inversely proportional to a number of filter coefficients in the second group of filter coefficients.

22. The communication system filter of claim 18 wherein every iteration, the filter coefficients processing unit is operable to:

update the first group of filter coefficients using the first step size and the first error signal by:

determining a first filter output in response to the received signal by using only the first group of filter coefficients; and determining the first error signal based upon the first filter output and the expected output; and update the second group of filter coefficients using the second step size and the second error signal by:

determining a second filter output in response to the received signal using all of the plurality of filter coefficients; and determining the second error signal based upon the second filter output and the expected output.

23. The communication system filter of claim 18, wherein the communication system filter is one of a linear equalizer, a portion of a decision feedback equalizer, and a decision feedback equalizer.

24. The communication system filter of claim 18, wherein the filter coefficients processing unit is operable to iterate using one of a Least Mean Squares (LMS) algorithm and a modified LMS algorithm.

* * * * *

UNITED STATES PATENT AND TRADEMARK OFFICE
CERTIFICATE OF CORRECTION

PATENT NO. : 7,450,518 B2
APPLICATION NO. : 10/951318
DATED : November 11, 2008
INVENTOR(S) : Nabil R. Yousef It is certified that error appears in the above-identified patent and that said Letters Patent is hereby corrected as shown below:

Column 17, line 15, in Claim 5: replace "farther" with --further--.

Signed and Sealed this

Twenty-sixth Day of May, 2009

JOHN DOLL
*Acting Director of the United States Patent and Trademark Office*